(12) United States Patent
Schwetje

(10) Patent No.: US 11,315,717 B2
(45) Date of Patent: Apr. 26, 2022

(54) INDUCTIVE COMPONENT

(71) Applicant: Kaschke Components GmbH, Göttingen (DE)

(72) Inventor: Carsten Schwetje, Göttingen (DE)

(73) Assignee: Kaschke Components GmbH, Göttingen (DE)

( * ) Notice: Subject to any disclaimer, the term of this patent is extended or adjusted under 35 U.S.C. 154(b) by 418 days.

(21) Appl. No.: 16/467,247

(22) PCT Filed: Jan. 4, 2018

(86) PCT No.: PCT/EP2018/050187
§ 371 (c)(1),
(2) Date: Jun. 6, 2019

(87) PCT Pub. No.: WO2018/130454
PCT Pub. Date: Jul. 19, 2018

(65) Prior Publication Data
US 2020/0082967 A1  Mar. 12, 2020

(30) Foreign Application Priority Data

Jan. 11, 2017 (DE) ......................... 102017100458.0

(51) Int. Cl.
*H01F 17/00* (2006.01)
*H01F 27/26* (2006.01)
(Continued)

(52) U.S. Cl.
CPC ....... *H01F 17/0006* (2013.01); *H01F 27/266* (2013.01); *H01F 27/29* (2013.01);
(Continued)

(58) Field of Classification Search
CPC ............. H01F 17/0006; H01F 17/0013; H01F 2027/2809; H01F 27/2804; H01F 5/003;
(Continued)

(56) References Cited

U.S. PATENT DOCUMENTS 4,342,976 A * 8/1982 Ryser ...................... H01F 19/08
336/84 C
5,017,902 A * 5/1991 Yerman ............... H01F 27/2804
336/183
(Continued)

FOREIGN PATENT DOCUMENTS

| CN | 201138608 Y | 10/2008 | |
|---|---|---|---|
| DE | 102011003754 A1 * | 8/2012 | ............ B23K 11/24 |
| DE | 102014002298 B3 | 1/2015 | |

OTHER PUBLICATIONS

WIPO, International Search Report (on priority application), dated Apr. 12, 2018.

*Primary Examiner* — Tszfung J Chan
(74) *Attorney, Agent, or Firm* — Laurence P. Colton; Smith Tempel Blaha LLC

(57) ABSTRACT

An inductive component has at least one conductor loop arranged on a printed circuit board and at least one core made of inductive material that cooperates inductively with the conductor loop. The printed circuit board comprises an upper face, a lower face and narrow faces, and moreover at least two printed circuit board parts. Each printed circuit board part has a part of the at least one conductor loop. At least one of the printed circuit board parts comprises a first and a second contact portion. The first contact portion is connected to a first face, in particular the upper face, of the second printed circuit board part and the second contact portion is connected to a second face, in particular the lower face, of the second printed circuit board part, which second face is different from the first face.

12 Claims, 6 Drawing Sheets

(51) Int. Cl.
    *H01F 27/29*         (2006.01)
    *H01F 27/30*         (2006.01)
    *H05K 1/02*          (2006.01)
    *H05K 1/03*          (2006.01)
    *H05K 1/16*          (2006.01)

(52) U.S. Cl.
    CPC ......... *H01F 27/306* (2013.01); *H05K 1/0278* (2013.01); *H05K 1/0346* (2013.01); *H05K 1/165* (2013.01); *H01F 2017/006* (2013.01); *H01F 2017/0073* (2013.01); *H05K 2201/058* (2013.01)

(58) Field of Classification Search
    CPC ....... H01F 2017/006; H01F 2017/0073; H01F 27/29; H01F 2027/295; H01F 2027/297; H01F 27/306; H01F 27/266; H05K 1/0278; H05K 2201/058; H05K 1/165
    USPC .......................................... 336/200, 206, 232
    See application file for complete search history.

(56) References Cited

U.S. PATENT DOCUMENTS

| | | | | |
|---|---|---|---|---|
| 5,801,602 A | * | 9/1998 | Fawal | ................. H01F 17/0006 333/177 |
| 2002/0110013 A1 | * | 8/2002 | Park | ....................... H02J 50/10 363/153 |
| 2016/0126002 A1 | * | 5/2016 | Chien | ...................... H04B 5/00 320/108 |

* cited by examiner

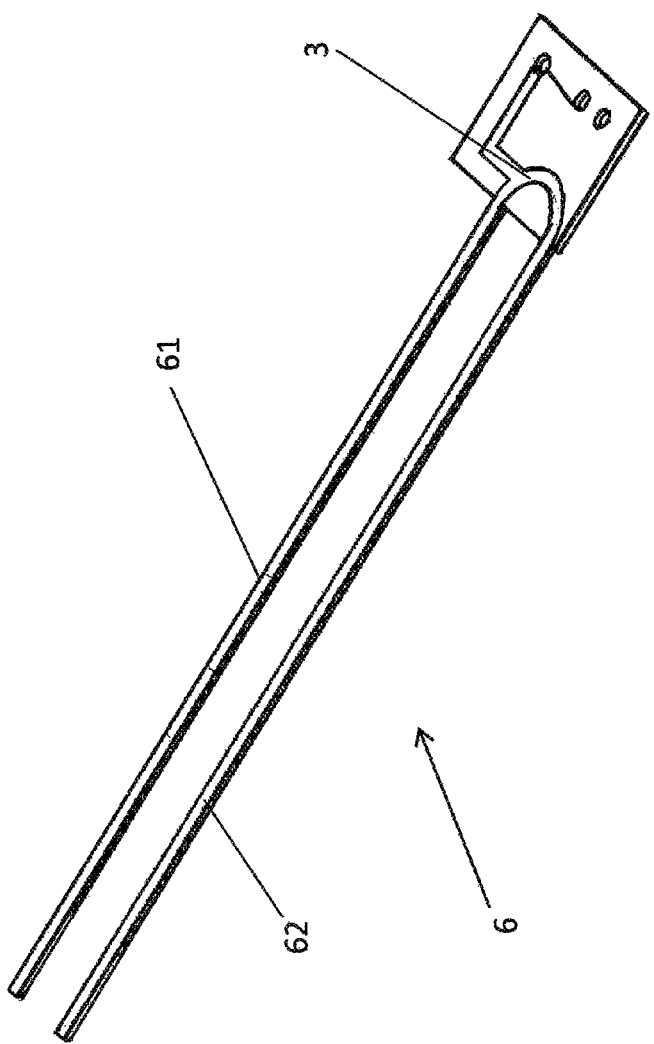

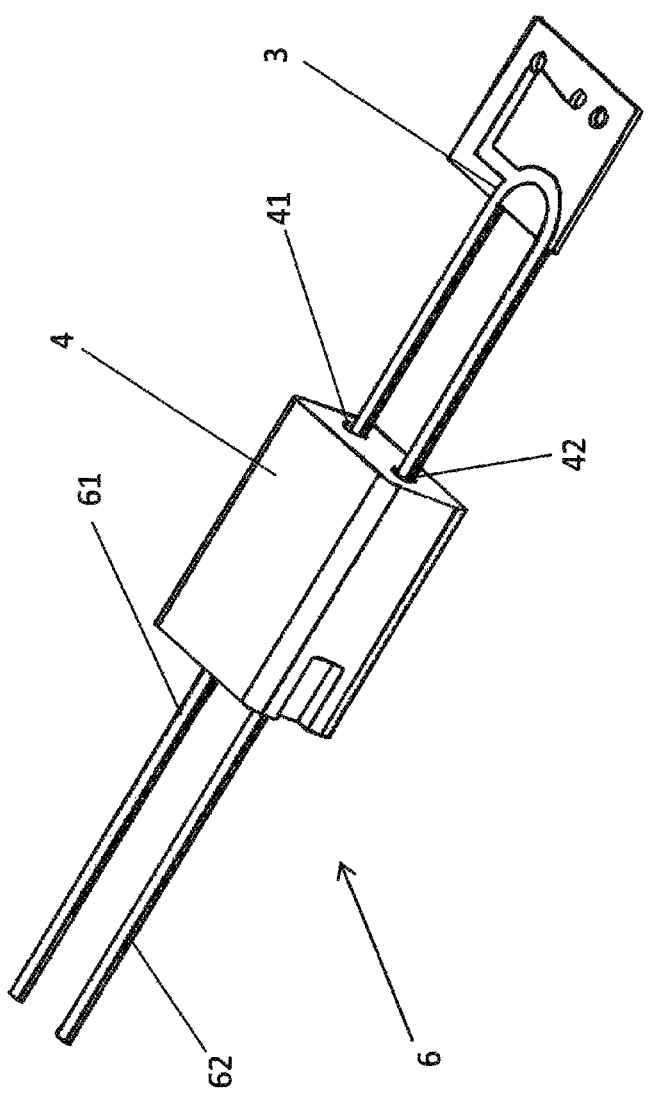

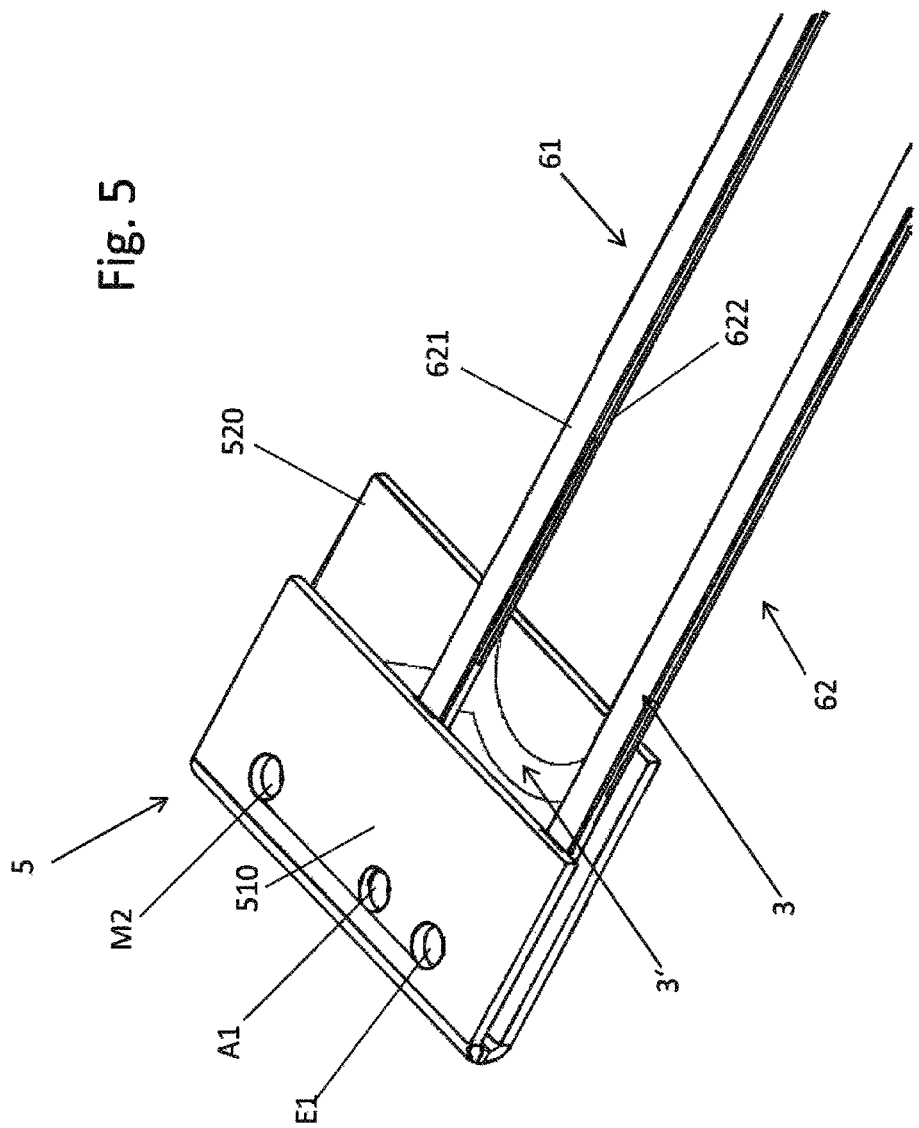

INDUCTIVE COMPONENT

CROSS REFERENCE TO RELATED APPLICATIONS

This application is the US National Phase of and claims the benefit of and priority on International Application No. PCT/EP2018/050187 having an international filing date of 4 Jan. 2018, which claims priority on German Patent Application No. 10 2017 100 458.0 having a filing date of 11 Jan. 2017.

BACKGROUND OF THE INVENTION

Technical Field

The invention relates to inductive components, as used in transmission devices for computer networks, for example.

Prior Art

In computer networks, inductive components in particular are used for galvanic isolation between the electric circuits, in order to be able to achieve high transmission rates between different terminals of a network installation that are in the range of a few gigabits per second and are as interference free as possible.

Known components have two terminal faces, to each of which a conductor loop is coupled. The two conductor loops are each in the form of a wire, and are arranged twisted together and interlaced. The twisted regions are then passed through holes of cores which are made from an inductive material. In an arrangement of this kind, the problem is that the wires from which the conductor loops are formed have to first be twisted and then the corresponding hole core has to be opened before the contact takes place. This manufacturing method is complex.

BRIEF SUMMARY OF THE INVENTION

The object of the present invention is therefore to provide an inductive component which can be produced in a less complex manner.

This object is achieved by an inductive component comprising at least one conductor loop arranged on a printed circuit board and at least one core made of an inductive material that inductively cooperates with the conductor loop, wherein the printed circuit board comprises an upper face, a lower face and narrow faces and moreover at least two printed circuit board parts, each of which has a part of the at least one conductor loop, wherein at least one of the printed circuit board parts comprises a first and a second contact portion, wherein the first contact portion is connected to a first face, in particular the upper face, of the second printed circuit board part and the second contact portion is connected to a second face, in particular the lower face, of the second printed circuit board part, which second face is different from the first face. Advantageous embodiments can be found in the dependent claims.

The invention is based on the fundamental concept of providing the conductor loop of the inductive component on a printed circuit board and then assembling the printed circuit board from a plurality of components such that the conductor loop is also assembled by connecting the printed circuit board components. In this way, for example, a double-hole core can be pushed onto the one part of the printed circuit board or the one part of the conductor loop, and the printed circuit board or conductor loop can subsequently be completed. Thus, a relatively simple construction of the inductive component can be achieved, in particular if not only one conductor loop is present, but the inductive component has at least two electrically mutually insulated conductor loops, similar to a transformer. At least one of the printed circuit board parts is preferably equipped or coated with portions of at least one conductor loop, preferably with portions of two conductor loops on the upper face and the lower face of the printed circuit board part. The other part of the printed circuit board to be combined therewith has corresponding coatings or provisions comprising conductor tracks such that one or more conductor loops can be completed by combining the two printed circuit board parts.

According to the present invention, an inductive component has at least one conductor loop arranged on a printed circuit board, and at least one core made of inductive material that inductively cooperates with the conductor loop. In this case, the printed circuit board comprises an upper face, a lower face and narrow faces, and moreover at least two printed circuit board parts, each of which comprises a part of the at least one conductor loop. At least one of the printed circuit board parts in this case comprises a first and a second contact portion, the first contact portion being connected to a first face, in particular the upper face, of the second printed circuit board part and the second contact portion being connected to a second face, in particular the lower face, of the second circuit board part, which second face is different from the first face.

In this way, one printed circuit board part can be "placed around" the other printed circuit board part, as it were, thereby completing the conductor loop or conductor loops. When completing the conductor loop, conductor loop portions are contacted on the two parts of the printed circuit board. If a conductor loop is present, only two solder joints are required for fixing the contact, and in the case of two mutually electrically isolated conductor loops, four solder joints are correspondingly required.

In a preferred embodiment, the at least one conductor loop is passed through the at least one core. The induction effect of the at least one conductor loop is increased by means of this arrangement. In a particularly preferred embodiment, the core comprises two holes through each of which a part of the conductor loop passes. If the at least one conductor loop is passed through two holes in the core, the induction effect of the at least one conductor loop increases.

In a further preferred embodiment, the first and/or the second printed circuit board part has at least one projection onto which the at least one core, which preferably has at least one hole for this purpose, can be fitted. If the at least one conductor loop is attached to a printed circuit board which is formed from two printed circuit board parts, then either the two projections can be attached to one of the parts or one projection can be attached to each of the parts, on which projection at least parts of the conductor loop are attached. These projections are designed such that they can each be inserted into one of the holes in the core and subsequently connected to the other printed circuit board part. It is also possible, however, that the two projections which carry a part of the conductor loop are attached to one of the printed circuit board parts. The cores are therefore attached to the projections at the same time and the at least one loop is subsequently finished using the second printed circuit board part.

In a preferred embodiment, at least one printed circuit board part comprises a plastics material. Especially when there is more than one conductor loop, it is necessary to insulate the conductors from one other, in order to achieve galvanic isolation of the conductor loops. In this case, plastics material can be used as an insulator. In a particularly preferred embodiment, polyamide is used as the plastics material.

The at least one core consists of an inductive material, the material preferably comprising a ferrite material. By using ferrite materials, the size of the core can be reduced while having the same effect.

In a preferred embodiment, the contact portions of a printed circuit board part are interconnected via a joining portion. In a preferred embodiment, the joining portion is a film hinge; in a further preferred embodiment, the joining portion is a folding edge. In this way, the assembly of the inductive component can be accomplished particularly easily: the one printed circuit board part is equipped with the core and the projections are placed on the other circuit board part at the corresponding contact points. One contact portion of the printed circuit board part is then "folded" onto the projections such that the conductor loop(s) is/are completed.

In a further preferred embodiment, the conductor tracks are arranged on the printed circuit board in such a way that, by means of the two assembled printed circuit boards, they have at least two conductor loops which are electrically insulated from one another.

In another preferred embodiment, the printed circuit board is coated on the upper face and/or the lower face with conductor track portions.

In a further preferred embodiment, each conductor loop is connected at the beginning and end thereof to a first and second terminal contact, respectively. By means of these terminal contacts, the completed inductive component can then be electrically connected to other components.

In a particularly preferred embodiment, the first and second terminal contacts are arranged on the same printed circuit board part. This simplifies the assembly of the component considerably, since terminal contacts associated in this way can be arranged close to one another.

In a further embodiment, the inductive component is designed as a transformer which has a primary conductor loop and a secondary conductor loop. In a particularly preferred embodiment, the first printed circuit board part has two terminal contacts for the primary conductor loop and the second printed circuit board part has the terminal contacts for the secondary conductor loop. In a very preferred embodiment, the first and the second printed circuit board part each have a first and a second contact portion. In an especially preferred embodiment, the two printed circuit board parts are of identical design and each have one projection, on the lower face and upper face of which conductor track portions of the primary or secondary conductor loop are arranged.

BRIEF DESCRIPTION OF THE DRAWINGS

In the following, the invention will be explained in greater detail with reference to embodiments.

FIG. 2 shows a printed circuit board part,

FIG. 3 shows a printed circuit board part onto which a core is pushed.

FIG. 5 shows a part of a mounted printed circuit board.

DETAILED DESCRIPTION OF PREFERRED EMBODIMENTS

Figure 1:
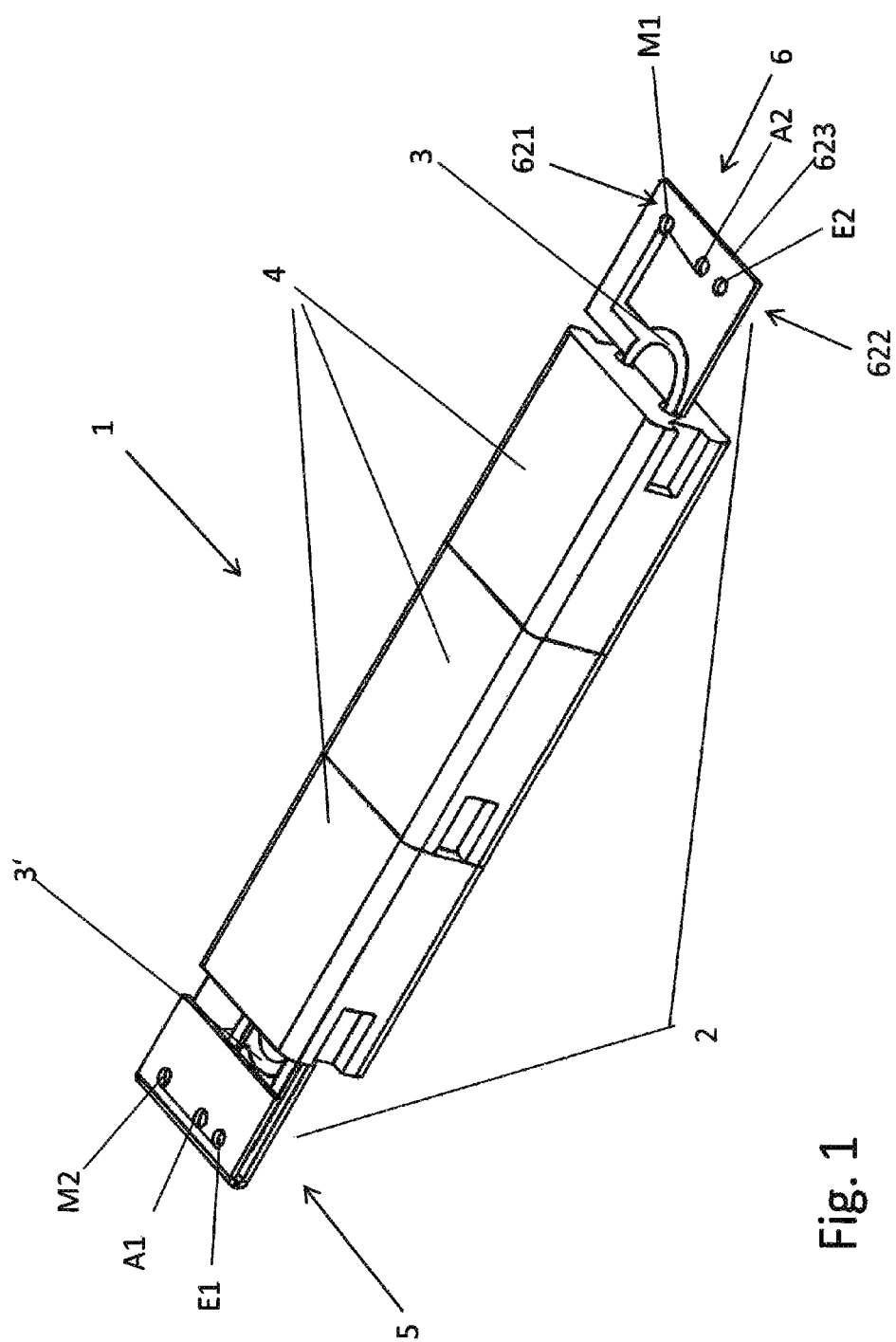
FIG. 1 shows an inductive component in the finished state.

FIG. 1 is a perspective view of an inductive component 1 according to the invention in a fully assembled state. In the example shown, the inductive component 1 has conductor loops 3, 3' arranged on a printed circuit board 2. The printed circuit board 2 comprises an upper face 621, a lower face 622 and narrow faces 623 and two printed circuit board parts 5, 6, each of which has one part of the at least one conductor loop 3, 3'. In the embodiment shown, the printed circuit board part 6, as shown in FIG. 2, has two projections 61, 62.

During assembly of the inductive component 1, as shown in FIG. 3, a core 4 made of inductive material, in which two holes 41, 42 are made, is pushed onto the projections 61, 62, In the embodiment of the inductive component 1 shown in FIG. 1, three cores 4 are pushed onto the projections 61, 62 by way of example. The inductive component 1 is completed by attaching the printed circuit board part 5. The assembly of the printed circuit board part 5 is explained with reference to FIGS. 4A, 4B and 5.

Figure 4A:
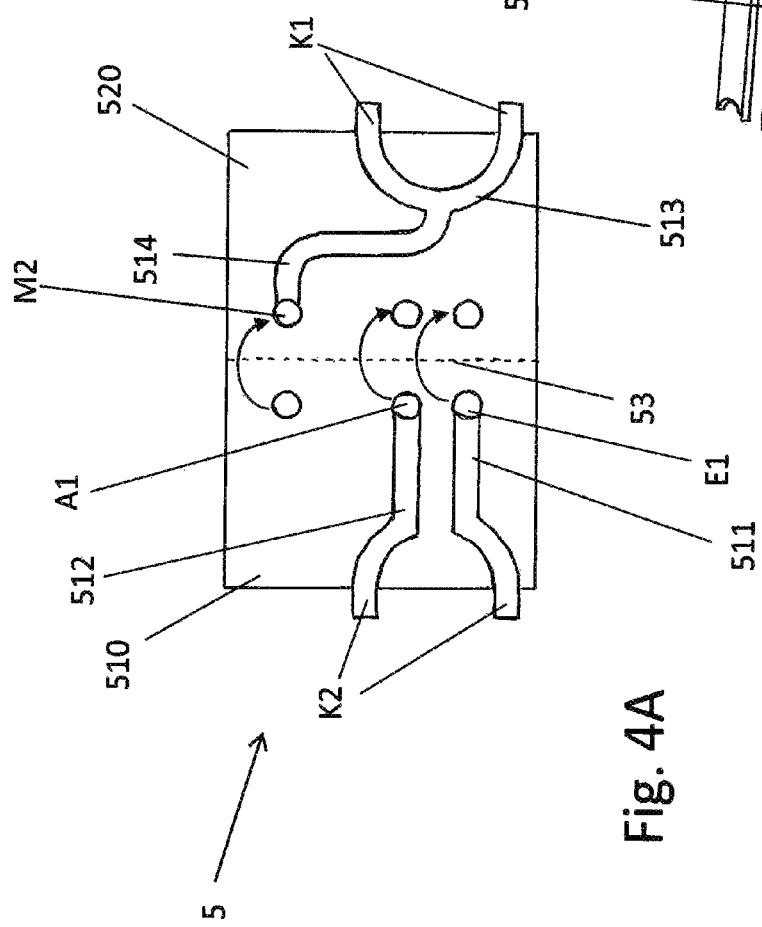
FIG. 4 shows the other printed circuit board part, with FIG. 4A showing the printed circuit board part in the initial open state and FIG. 4B showing the position of the different conductor loop portions in the mounted state.

FIG. 4A shows the printed circuit board part 5 in the initial state. The printed circuit board part 5 consists of a first contact portion 510 and a second contact portion 520, which are interconnected via a joining portion 53. In this embodiment, the first contact portion 510 has two contact points K2 for connecting to the conductor portion of the other printed circuit board part 6. These contact points are each connected to the terminal contacts A1 and E1 by means of a terminal connection 511, 512. The contacts are designed as holes to which external cables can be attached. The second contact portion 520 likewise has two contact points K1 for connection to the conductor portion of the other printed circuit board part 6, and the two contact points K1 are connected via a conductor loop portion 513, which is shown here by way of example as approximately semicircular. This conductor loop portion 513 is connected via an optional central terminal connection 514 to an optional central contact M2, which is likewise designed as a hole. Holes are made in the other contact portion 520, 510 such that, in the folded state, the holes of the contacts A1, E1 and M2 run continuously through the two contact portions 510, 520.

Figure 4B:
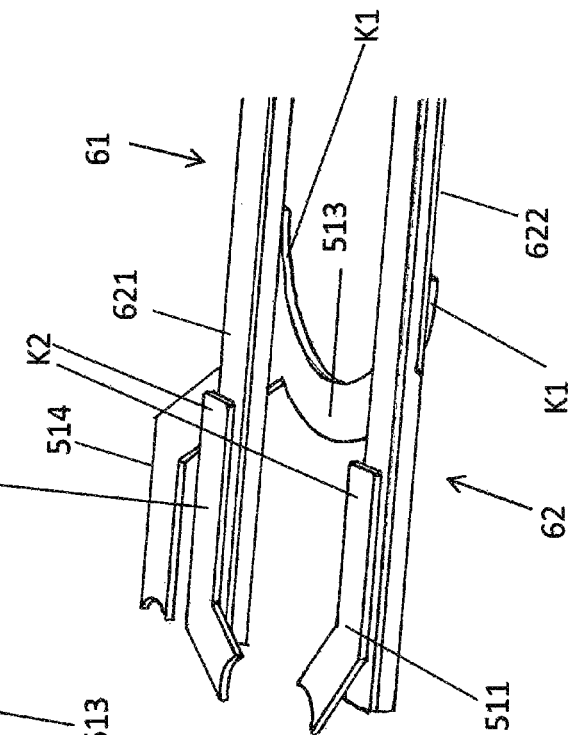

During assembly, the projections 61, 62 of the other printed circuit board part 6, as shown in FIG. 5, are placed such that the lower face 622 is on the second contact portion 520 of the printed circuit board part 5, and the first contact portion 510 is folded at the joining portion 53 over the upper face 621 of the projections 61, 62. The contacts produced during assembly are shown in FIG. 4B. The contact points K2 of the printed circuit board part 5 rest on the conductive upper face 621 of the projections 61, 62 and establish a connection between the terminal contacts A1, E1 and the conductive upper face of the projections 61, 62 via the terminal connection 511, 512. The contact points K1 establish a connection to the conductive lower faces 622 of the projections 61, 62. The lower faces 622 of the two projections 61, 62 are interconnected via the conductor loop portion 513. A conductive connection is established between the loop on the lower face 622 and the central contact M2 via the central terminal connection 514.

As shown in FIG. 1, the printed circuit board part 6 has a conductive connection on the upper face 621 between the projections 61, 62 (not shown) equipped or coated with conductor tracks on the upper face, and thereby forms the first conductor loop 3. The lower face of the projections 61, 62 is also equipped or coated with conductor tracks such that, as a result, the second conductor loop 3' is formed over the printed circuit board part 5 in a similar manner. Since the material of the printed circuit boards otherwise consists of insulating material, the two conductor loops 3, 3' are galvanically isolated from one another.

In this embodiment, the conductor loop on the upper face 621 is supplied/tapped by the terminal contacts A1 and E1 and the conductor loop 3' on the lower face 622 by the terminal contacts A2 and E2. Signal information can then be inductively exchanged between the conductor loops without galvanic contact between the conductor loops.

Figure 6:
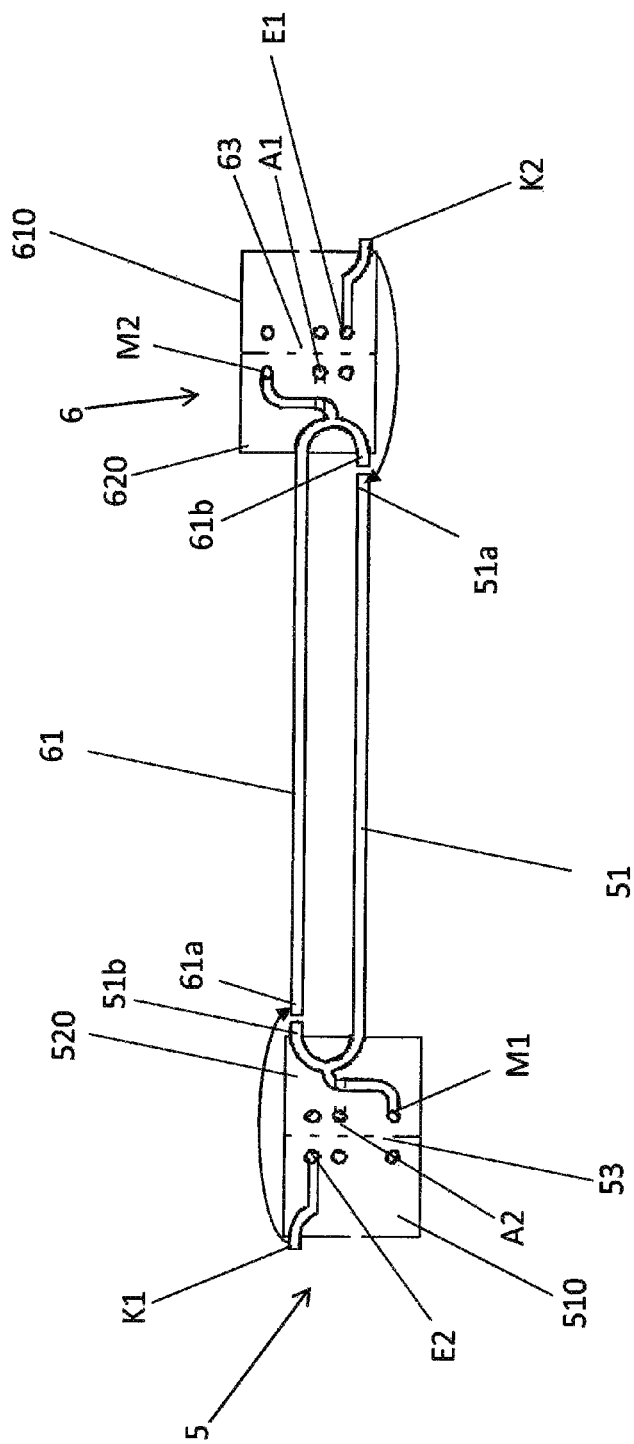
FIG. 6 shows a further embodiment of a printed circuit board.

FIG. 6 shows a further embodiment of the invention. The two printed circuit board parts 5, 6 are constructed in a substantially identical manner. The basic structure of the printed circuit board parts 5, 6 corresponds to that of the printed circuit board part described in FIGS. 4A, 4B and 5.

The printed circuit board part 5, 6 has in each case a first contact portion 510, 610, each having a contact point K1, K2 which is connected to a terminal contact E2, E1. The second contact portion 520, 620 carries the conductor loop portion comprising the central contact M1, M2, which is also optional in this case, and the terminal contact A1 A2, this being connected on the lower face of the second contact portion 520, 620 to the conductive lower face of the relevant projection 51, 61 which is fixedly connected to the contact portion. If the two printed circuit board parts 5, 6 are completely assembled, a conductor loop 3 is produced over the lower face of the projection 61, from A1 to the lower contact point 51b, From there, the connection is directed to the conductive upper face of the projection 51 and there directed to the terminal connection E1 via the upper contact point K2. The other conductor loop 3' leads from A2 to the conductive lower face of the projection 51, is connected to the lower contact point 61b, and leads to the conductive upper face of the projection 61. At the upper contact point 61a, the connection via K1 to the contact point E2 is established. The two conductor loops are galvanically isolated from one another.

The simple assembly of these inductive components 1 with respect to the prior art enables a quick, easy assembly, which brings with it time savings during assembly and enables mechanical assembly, which brings with it an economic advantage.

What is claimed is:

1. An inductive component (1) comprising at least one conductor loop (3, 3') arranged on a printed circuit board (2) and at least one core (4) made of a ferrite material that inductively cooperates with the at least one conductor loop (3, 3'),
wherein the printed circuit board (2) comprises an upper face (621), a lower face (622) and narrow faces (623) and moreover at least two printed circuit board parts (5, 6), each of which has a part of the at least one conductor loop (3, whereby the conductor loop parts on the at least two printed circuit board parts (5, 6) are brought into contact with each other to complete the at least one conductor loop (3, 3'),
wherein at least a first of the printed circuit board parts (5, 6) comprises a first contact portion (510, 610) and a second contact portion (520, 620), wherein the first contact portion (510, 610) is connected to a first face, namely to the upper face (621), of a second of the printed circuit board parts (6) and the second contact portion (520, 620) is connected to a second face, namely to the lower face (622), of the second printed circuit board part (6), which second face is different from the first face, and
wherein the first and/or the second printed circuit board part has at least one projection (51; 61, 62) onto which the at least one core (4) can be fitted.

2. The inductive component (1) according to claim 1, wherein the at least one conductor loop (3, 3') is passed through the at least one core (4).

3. The inductive component (1) according to claim 2, wherein the at least one core (4) comprises two holes (41, 42) through each of which a part of the at least one conductor loop (3, 3') passes.

4. The inductive component (1) according to claim 1, wherein at least one of the at least two printed circuit board parts (5, 6) comprises a plastic material.

5. The inductive component according to claim 4, wherein the plastic material is polyamide.

6. The inductive component (1) according to claim 1, wherein the first contact portion (510) and the second contact portion (520) are interconnected via a joining portion (53).

7. The inductive component according to claim 6, wherein the joining portion (53) is a film hinge or a folding edge.

8. The inductive component (1) according to claim 1, further comprising conductor tracks arranged on the printed circuit board (2) such that, by means of the two assembled printed circuit board parts (5, 6), the conductor tracks have at least two of the at least one conductor loop (3, 3') which are electrically insulated from one another.

9. The inductive component (1) according to claim 1, wherein the printed circuit board (2) is coated on the upper face and/or the lower face with conductor track portions.

10. The inductive component (1) according to claim 1, wherein each of the at least one conductor loop (3; 3') is connected at the start and end thereof to a first and second terminal contact (A1, E1; A2, E2), respectively.

11. The inductive component (1) according to claim 10, wherein the first and second terminal contacts (A1, E1) are arranged on a same of the at least two printed circuit board parts (5, 6).

12. An inductive component (1) comprising at least one conductor loop (3, 3') arranged on a printed circuit board (2) and at least one core (4) made of a ferrite material that inductively cooperates with the at least one conductor loop (3, 3'), wherein:
the printed circuit board (2) comprises an upper face (621), a lower face (622) and narrow faces (623) and moreover at least two printed circuit board parts (5, 6), each of which has a part of the at least one conductor loop (3, 3'), whereby the conductor loop parts on the at least two printed circuit board parts (5, 6) are brought into contact with each other to complete the at least one conductor loop (3, 3');
at least a first of the printed circuit board parts (5, 6) comprises a first contact portion (510, 610) and a second contact portion (520, 620), wherein the first contact portion (510, 610) is connected to a first face, namely to the upper face (621), of a second printed of the circuit board parts (6) and the second contact portion (520, 620) is connected to a second face, namely to the lower face (622), of the second printed circuit board part (6), which second face is different from the first face;

the inductive component (1) is a transformer wherein one of the at least one conductor loop (3, 3') is a primary conductor loop (3) and further comprising a secondary conductor loop (3');

the first of the at least two printed circuit board parts (5) has two terminal contacts (A1, E1) for the primary conductor loop (3) and the second of the at least two printed circuit board parts (6) has two terminal contacts (A2, E2) for the secondary conductor loop (3');

the first and the second printed circuit board parts (5, 6) each have the first and the second contact portion (510, 610; 520, 620); and the at least two printed circuit board parts (5, 6) are of identical design and each has a projection (51, 61), on the lower face and the upper face of which conductor track portions of the primary conductor loop (3) or the secondary conductor loop (3') are arranged.

\* \* \* \* \*